United States Patent
Yuan et al.

(10) Patent No.: US 7,138,300 B2
(45) Date of Patent: Nov. 21, 2006

(54) STRUCTURAL DESIGN FOR FLIP-CHIP ASSEMBLY

(75) Inventors: Tsorng-Dih Yuan, Hopewell Junction, NY (US); Hsin-Yu Pan, Taipei (TW); Chung-Yi Lin, Shinying (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 4 days.

(21) Appl. No.: 10/947,592

(22) Filed: Sep. 22, 2004

(65) Prior Publication Data

US 2006/0063300 A1     Mar. 23, 2006

(51) Int. Cl.
*H01L 21/50* (2006.01)

(52) U.S. Cl. .................................. 438/122; 438/127

(58) Field of Classification Search ................ 438/106, 438/108, 122, 124, 127
See application file for complete search history.

(56) References Cited

U.S. PATENT DOCUMENTS

| | | | |
|---|---|---|---|
| 4,561,040 A | 12/1985 | Eastman et al. | |
| 4,583,283 A | 4/1986 | Dubois et al. | |
| 4,914,551 A | 4/1990 | Anschel | |
| 5,057,909 A | 10/1991 | Mok et al. | |
| 5,151,388 A | 9/1992 | Bakhit et al. | |
| 5,289,337 A | 2/1994 | Aghazadeh et al. | |
| 5,311,402 A | 5/1994 | Kobayashi et al. | |
| 5,346,861 A | 9/1994 | Khandros et al. | |
| 5,371,404 A * | 12/1994 | Juskey et al. ............ 257/659 |
| 5,459,352 A | 10/1995 | Layton et al. | |
| 5,497,027 A | 3/1996 | Crafts | |
| 5,504,652 A | 4/1996 | Foster et al. | |
| 5,521,406 A | 5/1996 | Tserng et al. | |
| 5,579,249 A * | 11/1996 | Edwards ................ 703/2 |
| 5,610,442 A | 3/1997 | Schneider et al. | |
| 5,621,615 A | 4/1997 | Dawson et al. | |
| 5,650,918 A | 7/1997 | Suzuki | |
| 5,723,369 A | 3/1998 | Barber | |
| 5,736,785 A | 4/1998 | Chiang et al. | |
| 5,744,863 A | 4/1998 | Culnane et al. | |
| 5,744,869 A | 4/1998 | Root | |
| 5,757,081 A | 5/1998 | Chang et al. | |
| 5,767,578 A | 6/1998 | Chang et al. | |
| 5,785,799 A | 7/1998 | Culnane et al. | |
| 5,789,810 A | 8/1998 | Gross et al. | |
| 5,801,072 A | 9/1998 | Barber | |

(Continued)

FOREIGN PATENT DOCUMENTS

JP        2-28351        1/1990

(Continued)

OTHER PUBLICATIONS

"Technical Forum-Chip-Scale Packages for Center-Pad Memory Devices (Con't)", May 1998, pp. 1-7 at http://www.chipscalereview.com/issues/0598/amagaiA2.htm Jun. 2, 2004.

(Continued)

*Primary Examiner*—Scott B. Geyer
(74) *Attorney, Agent, or Firm*—Duane Morris LLP

(57) ABSTRACT

An integrated circuit package comprises a semiconductor die located on a substrate in a flip-chip configuration, an encapsulant layer overlying the non-active surface of the semiconductor die and at least a portion of the surface of the substrate adjacent the die, and a heat spreader comprising a thermally conductive material. The heat spreader directly interfaces to a top surface of the encapsulant layer overlying the die and the substrate. This package provides physical protection during handling and reduced die stress and warpage.

12 Claims, 5 Drawing Sheets

U.S. PATENT DOCUMENTS

| | | | |
|---|---|---|---|
| 5,883,430 A * | 3/1999 | Johnson | 257/706 |
| 5,903,436 A | 5/1999 | Brownell et al. | |
| 5,986,885 A | 11/1999 | Wyland | |
| 6,187,601 B1 | 2/2001 | Hu et al. | |
| 6,285,078 B1 | 9/2001 | Nelson | |
| 6,410,988 B1 * | 6/2002 | Caletka et al. | 257/778 |
| 6,411,507 B1 | 6/2002 | Akram | |
| 6,459,144 B1 * | 10/2002 | Pu et al. | 257/667 |
| 6,507,116 B1 * | 1/2003 | Caletka et al. | 257/778 |
| 6,512,295 B1 * | 1/2003 | Gaynes et al. | 257/738 |
| 6,661,103 B1 * | 12/2003 | Akram | 257/787 |
| 6,681,482 B1 * | 1/2004 | Lischner et al. | 29/840 |
| 6,720,650 B1 * | 4/2004 | Miyazaki | 257/707 |
| 6,750,552 B1 * | 6/2004 | Narayanan | 257/786 |

FOREIGN PATENT DOCUMENTS

| | | |
|---|---|---|
| JP | 05235098 | 10/1993 |
| JP | 5-291421 | 11/1993 |
| JP | 08078584 A | 3/1996 |
| JP | 9326418 | 12/1997 |
| JP | 10032305 A | 2/1998 |
| TW | 529112 | 4/2003 |

OTHER PUBLICATIONS

"Aluminum Nitride Cap Design Obviating Problems Of Thermal Conductivity And TEC Associated With Polymer-Ceramic Substrate", IBM Technical Disclosure Bulletin, vol. 34, No. 78, Dec. 1991, pp. 341-342.

* cited by examiner

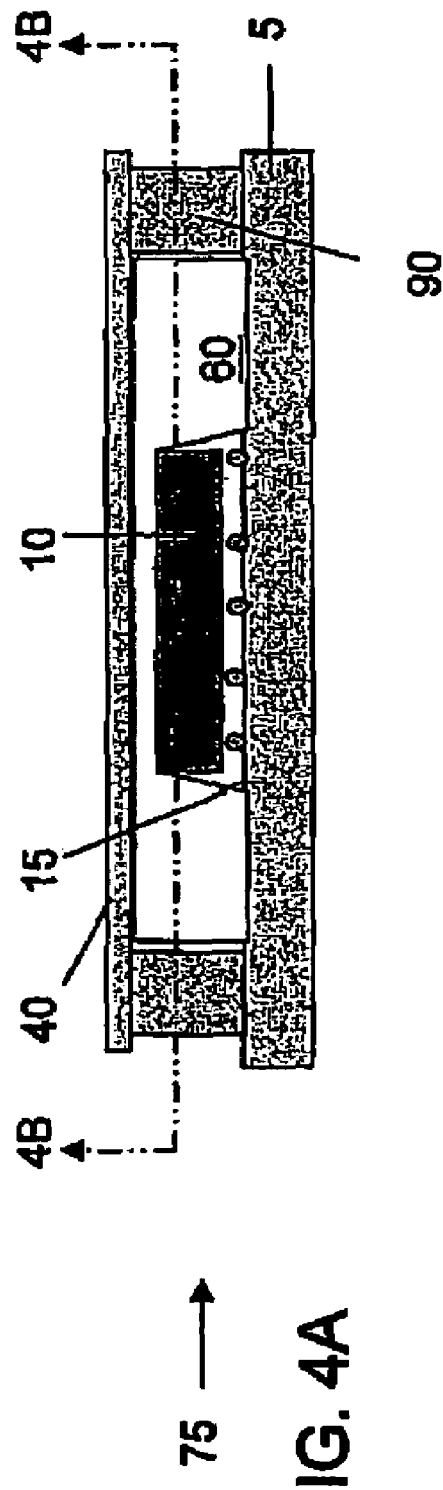
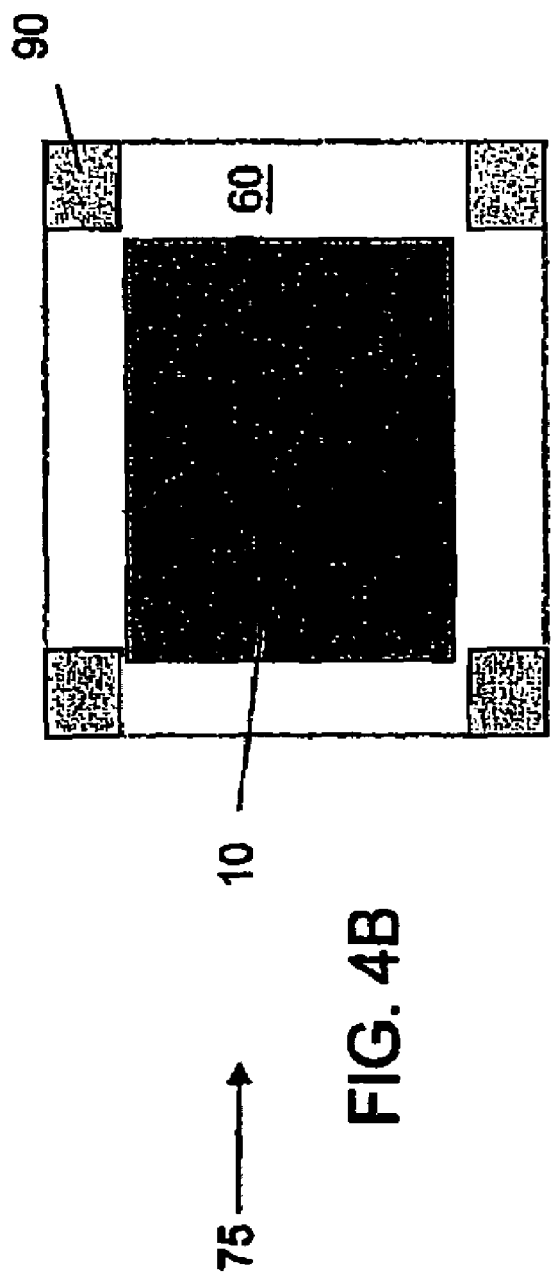

STRUCTURAL DESIGN FOR FLIP-CHIP ASSEMBLY

FIELD OF THE INVENTION

The present invention relates to semiconductor products generally, and more particularly to packages and packaging methods for flip chip devices.

BACKGROUND OF THE INVENTION

Flip chip technology provides a method for connecting an integrated circuit (IC) die to a substrate within a package. In the flip chip method, a plurality of electrical terminals are formed on an active face of the die. A respective solder bump is formed on each of the electrical terminals. The substrate has a plurality of terminal pads corresponding to the terminals on the die. The die is "flipped," so that the terminals of the device contact the pads of the substrate. Heat is applied to reflow the solder bumps, forming electrical and mechanical connections between the substrate and the active face of the die.

The flip chip package is very compact, and is also referred to a chip-scale package. The flip chip device poses design challenges, because a thermal mismatch between the die and the substrate may cause high die stress leading to a delamination failure. One method of reducing this problem is to cool the device by placing a heat spreader on the back (non-active) side of the die.

Both one piece and two piece heat spreaders are known in the art. U.S. Pat. No. 6,681,482 discloses several examples of single piece heat spreaders, and is fully incorporated herein by reference. The heat spreaders disclosed comprise thermally conductive material such as copper and multiple "legs" that are attached to the substrate to form a lid overlying the die to provide physical protection. The disclosed structures are open allowing easy flushing of a solvent for cleaning (open configuration). Prior art packages were sealed to prevent materials from entering and effecting the ICs during operation. If pinholes were present in the prior art sealed packages, any material penetrating the package could not be easily removed, thus reducing the operational lifetime of the IC. However, the disclosed structure of U.S. Pat. No. 6,681,482 does not achieve the operational life time of an IC effectively sealed (pinhole free) against the penetration of moisture in a high humidity environment.

FIG. 1 shows a cross-sectional view of a prior art example of a flip-chip package comprising a substrate 5, a die 10, an underfill material 15, a shaped one piece heat spreader 20, and a thermally conductive adhesive layer 25 between the heat spreader 20 and the die's non-active surface 30. FIG. 1 also shows an adhesive layer 35 attaching the one piece heat spreader 20 to the substrate 5.

FIG. 2 shows a cross-sectional view of a prior art example of a flip-chip package comprising a substrate 5, a die 10, and underfill material 15, a flat heat spreader 40, and a thermally conductive adhesive layer 25 between the heat spreader 40 and the die's non-active surface 30. The heat spreader 40 is attached to the substrate 5 by an intermediary insert 45. The heat spreader 40 is adhered to the insert 45 by an adhesive layer 47. Alternatively, if the insert 45 is made of an appropriate material it can be preattached to the heat spreader 40 by standard procedures which include welding, brazing or soldering. The insert is also attached to the substrate by an adhesive layer 50.

U.S. Pat. No. 6,411,507 discloses that Integrated circuit packages are very moisture sensitive. Extended exposure to humidity from the air may allow moisture to seep into the packages and damage them. For example, moisture seeping underneath a protective overcoat (PO) of an integrated circuit will cause the PO to delaminate. Therefore, it is desirable to encase integrated circuit dies in hermetically sealed packages, to protect them from moisture. These "closed cap" packages also protect integrated circuit dies from damage due to physical stress during assembly and testing.

Although prior art heat spreaders provide physical protection to the die during handling, they were not designed to provide protection against die stress and control of warpage of the die/substrate/heat spreader package.

Additionally, in chip-scale packages having a relatively large die and relatively small substrate, attachment of the heat spreader to the substrate may not be feasible. There may not be enough physical space between the end of the substrate and the underfill to allow even the designs in U.S. Pat. No. 6,681,482 to be attached with sufficient strength to provide physical protection to the die. Therefore, the selection of die size and substrate size is limited by this practical consideration. An improved package configuration is desired.

SUMMARY OF THE INVENTION

In some embodiments, a method of providing an integrated circuit package having a die connected to a substrate in a flip-chip configuration, comprises the steps of applying an encapsulant to a non-active surface of the die and at least a portion of an exposed surface of the substrate adjacent the die, providing a heat spreader made from a thermally conductive material, and attaching said heat spreader to the surface of the encapsulant.

In some embodiments, Finite Element Analysis (FEA) is employed as part of the method to provide an integrated circuit package with reduced warpage and die stress.

In some embodiments an integrated circuit package comprises a semiconductor die located on a substrate in flip-chip configuration, an encapsulant layer overlying the non-active surface of the semiconductor die and at least a portion of the surface of the substrate adjacent the die, and a heat spreader comprising a thermally conductive material, the heat spreader directly interfacing to a top surface of said encapsulant layer overlying the die and the substrate.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts and further wherein:

FIG. 4A is a cross-sectional front elevation view of one embodiment of the flip-chip package having a two piece heat spreader;

FIG. 4B is a cross-sectional view taken along section line 4B—4B of FIG. 4A.

DETAILED DESCRIPTION OF THE PREFERRED EMBODIMENT

Figure 1:
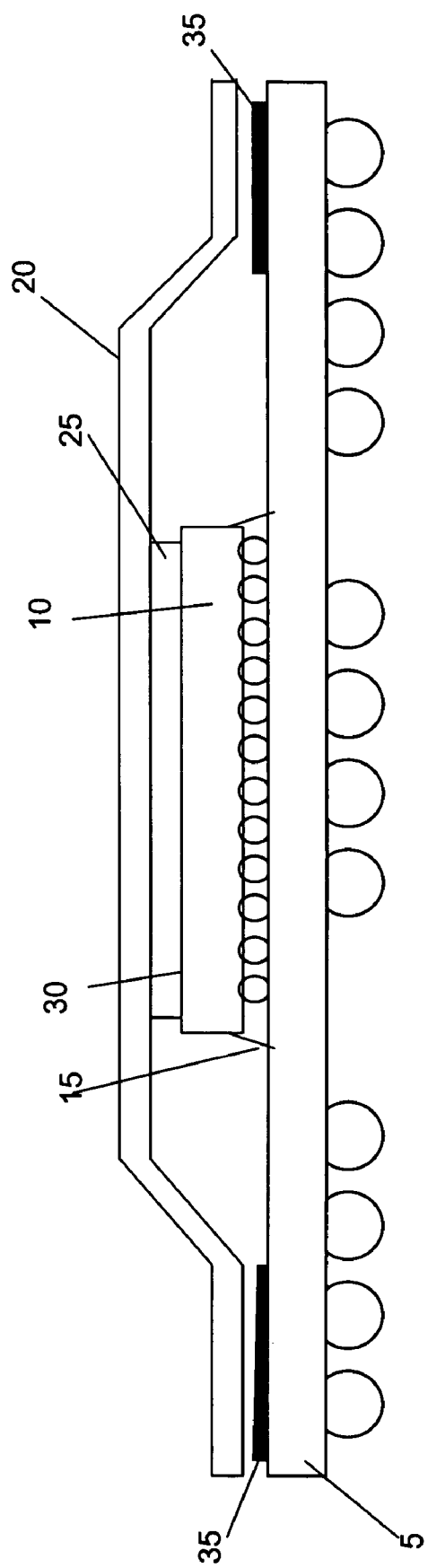
FIG. 1 is a cross-sectional view of a prior art flip-chip package having a one piece heat spreader.
Figure 2:
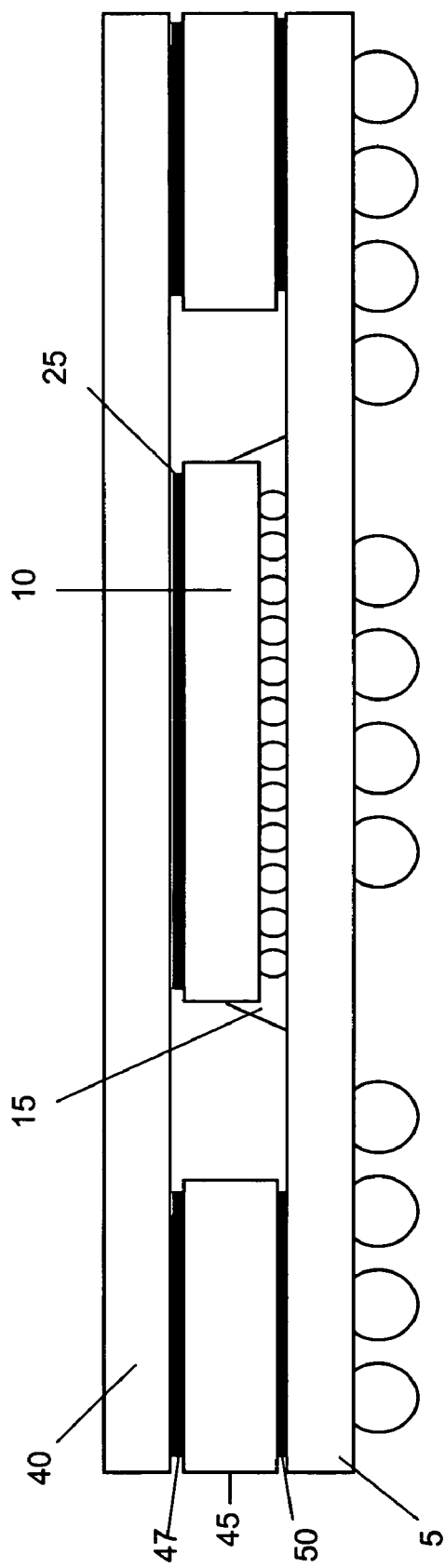
FIG. 2 is a cross-sectional view of a prior art flip-chip package having a two piece heat spreader.

These and other features and advantages of the exemplary embodiments will be more fully disclosed in, the following detailed description of the preferred embodiment, which is to be considered together with the accompanying drawings wherein like numbers refer to like parts and further wherein the drawings are to be considered part of the entire written description of the invention. Terms used to describe the preferred structure and process embodiments have traditional meaning in the art. Relative terms such as "horizontal", vertical, "up", "down", "top", "bottom" should be construed to refer to the orientation as described or as shown in the drawing figure under discussion. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship. The drawing figures are not necessarily to scale and certain features may be shown exaggerated in scale or in somewhat schematic form in the interest of clarity and conciseness.

Figure 3A:
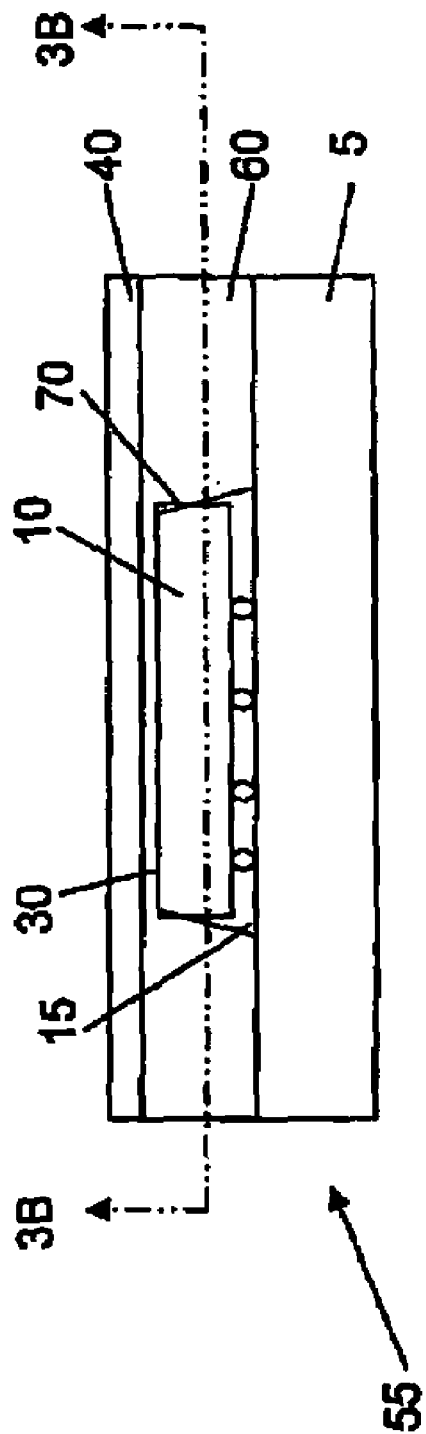
FIG. 3A is a cross-sectional front elevation view of one embodiment of the flip-chip package having a one piece heat spreader.
Figure 3B:
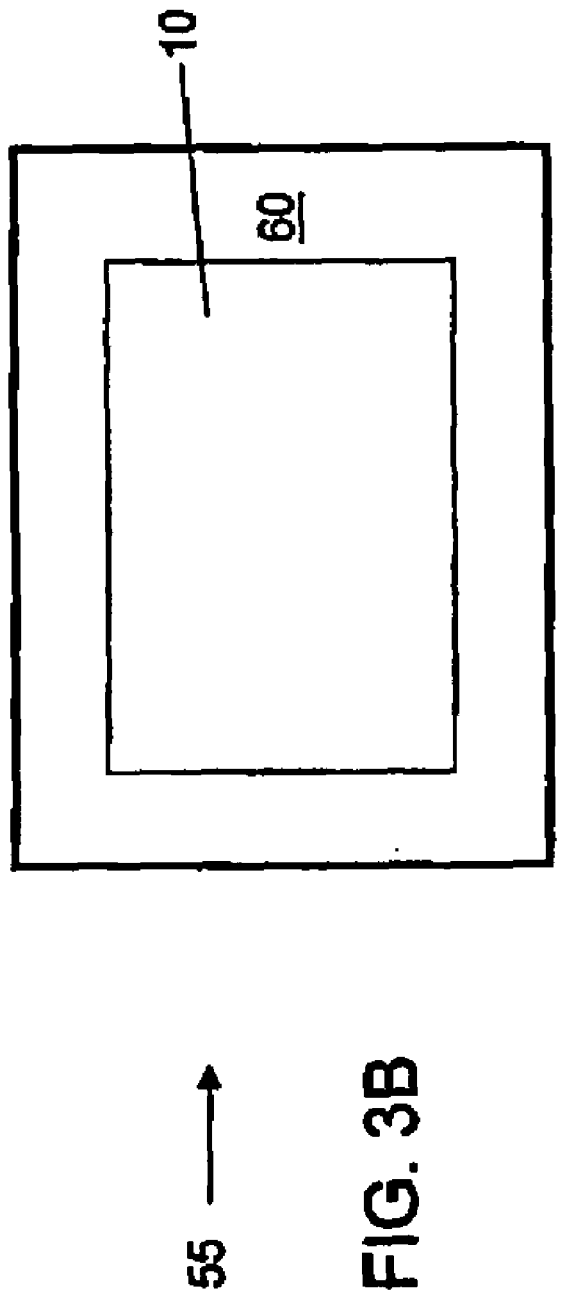
FIG. 3B is a cross-sectional view taken along section line 3B—3B of FIG. 3A.

Referring to FIG. 3A, a cross-sectional view shows an embodiment of a flip-chip package 55. This embodiment comprises a substrate 5, a die 10, and underfill material 15, a flat heat spreader 40, and an encapsulant 60 overlying the top surface 30 of the die and the surface of the substrate 5 adjacent to the die. The heat spreader is attached to the top surface of the encapsulant 60. FIG. 3B is a cross-sectional view taken along section line 3B—3B of FIG. 3A. FIG. 3B shows the encapsulant 60 in contact with at least a portion of the side surface 70 of die 10, as well as the top surface 30.

Referring to FIG. 4A, a cross-sectional view shows another embodiment of a flip-chip package 75. This embodiment comprises a substrate 5, a die 10, and underfill material 15, a heat spreader 40, and an encapsulant 60 overlying the top surface 30 of the die and the surface of the substrate adjacent to the die. The heat spreader 40 is attached to the top surface of the encapsulant 60. In this embodiment, the encapsulant 60 does not overlie the entire surface of the substrate, which allows the heat spreader 40 to be attached to the substrate 5. Some preferred embodiments utilize a two piece configuration as shown in FIG. 4A. FIG. 4B is a cross-sectional view taken along section line 4B—4B of FIG. 4A. In FIG. 4B, four corner posts 90 are used to attach the heat spreader 40 to the substrate 5. This embodiment shows a heat spreader 40 having a multiple-piece, plate and leg configuration comprising open sides (open configuration). Although FIGS. 3A, 3B, 4A and 4B show that the present examples provide open heat spreader configurations, closed cap configurations can be employed in some embodiments, if desired.

The encapsulant material 60 may comprise many different compositions. Moldable epoxy compounds are particularly suitable. Two preferred compositions are moldable compounds EME G770 and EME-7720 from Sumitomo Chemical Taiwan Co., Ltd., Taipee, Taiwan. The encapsulant is thermally conductive to transfer heat from the die to the heat spreader. Additionally, the encapsulant does not interfere with the operation of the integrated circuit package. The encapsulant is selected so that it can be applied to the flip-chip device in the physical arrangement desired. The encapsulant adheres to a non-active surface of the die, an exposed surface of the substrate, and the heat spreader. Once applied, the encapsulant should be continuous and protect the die from the penetration of moisture.

The encapsulant contributes to the mechanical performance of the final package. Since the encapsulant is in contact with the die, substrate, and heat spreader, the physical properties of the encapsulant affect how thermal stresses are translated and manifested in the final package. The encapsulant should be considered in any analysis of die stress and warpage in the final package. Although the thermal coefficient of expansion is an important physical property, its importance depends upon the particular die structure and heat spreader. The physical properties of the encapsulant provide an opportunity to help control the performance of the final package.

The process of creating an improved integrated circuit package having a semiconductor die connected to a substrate in a flip-chip configuration, an underfill, and a heat spreader may be accomplished as follows. A particular semiconductor die connected to a substrate in flip-chip configuration having an underfill is prepared. An encapsulant is selected and applied so that the encapsulant overlies a non-active surface of the die and an exposed surface of the substrate adjacent the die. One preferred process for applying the encapsulant is a molding process which may be compatible with existing manufacturing processes. A heat spreader material is selected. A heat spreader of the selected material is then adhered to the surface of the encapsulant overlying the non-active surface of the die and the surface of the substrate adjacent the die. The examples described above provide a practical solution to large die/small substrate packages not previously attainable.

The above process can be significantly enhanced by the use of Finite Element Analysis methods to select the encapsulant, the heat spreader material, as well as the specific size, shape and thickness of the heat spreader in order to reduce die stress and warpage in the integrated circuit package. Multiple structural simulations can be easily run using design of experiment to provide a relationship between the encapsulant, the heat spreader material, and the physical dimensions of the heat spreader to the resultant die stress and warpage properties. This provides an opportunity to specifically design an optimal structure to minimize die stress and warpage in the final integrated circuit package.

EXAMPLES

The invention is now described with reference to the following Examples. These Examples are provided for the purpose of illustration only, and the invention is not limited to these Examples, but rather encompasses all variations which are relevant as a result of the teachings provided herein.

Example 1

A series of integrated circuit packages according to FIG. 1 were prepared with three commercial thermally conductive adhesives used to attach the heat spreader to the top surface of the die. A corresponding integrated circuit package according to FIG. 3 was also prepared using EME-7720 obtained from Sumitomo Chemical as the encapsulant. The thermal performance of these integrated circuit packages were evaluated and the results are listed in the Table 1 below.

TABLE 1

| Cases | Tj max (C) | Tc max (C) | Rja (C/W) | Rjc (C/W) | Interface material |
|---|---|---|---|---|---|
| 1. One piece heat spreader + encapsulant | 110.52 | 99.80 | 2.02 | 0.36 | Molding compound, k = 0.66 w/mK |
| 2. One piece heat spreader + adhesive 1 | 111.04 | 99.23 | 2.03 | 0.39 | Adhesive, k = 0.6 w/mK |
| 3. One piece heat spreader + adhesive 2 | 108.10 | 100.01 | 1.94 | 0.27 | adhesive, k = 1 w/mK |
| 4. One piece heat spreader + adhesive 3 | 104.48 | 100.50 | 1.82 | 0.13 | adhesive, k = 2 w/mK |

These results indicate that thermal performance comparable to commercially viable integrated circuit packages can be achieved.

Example 2

Figure 5:
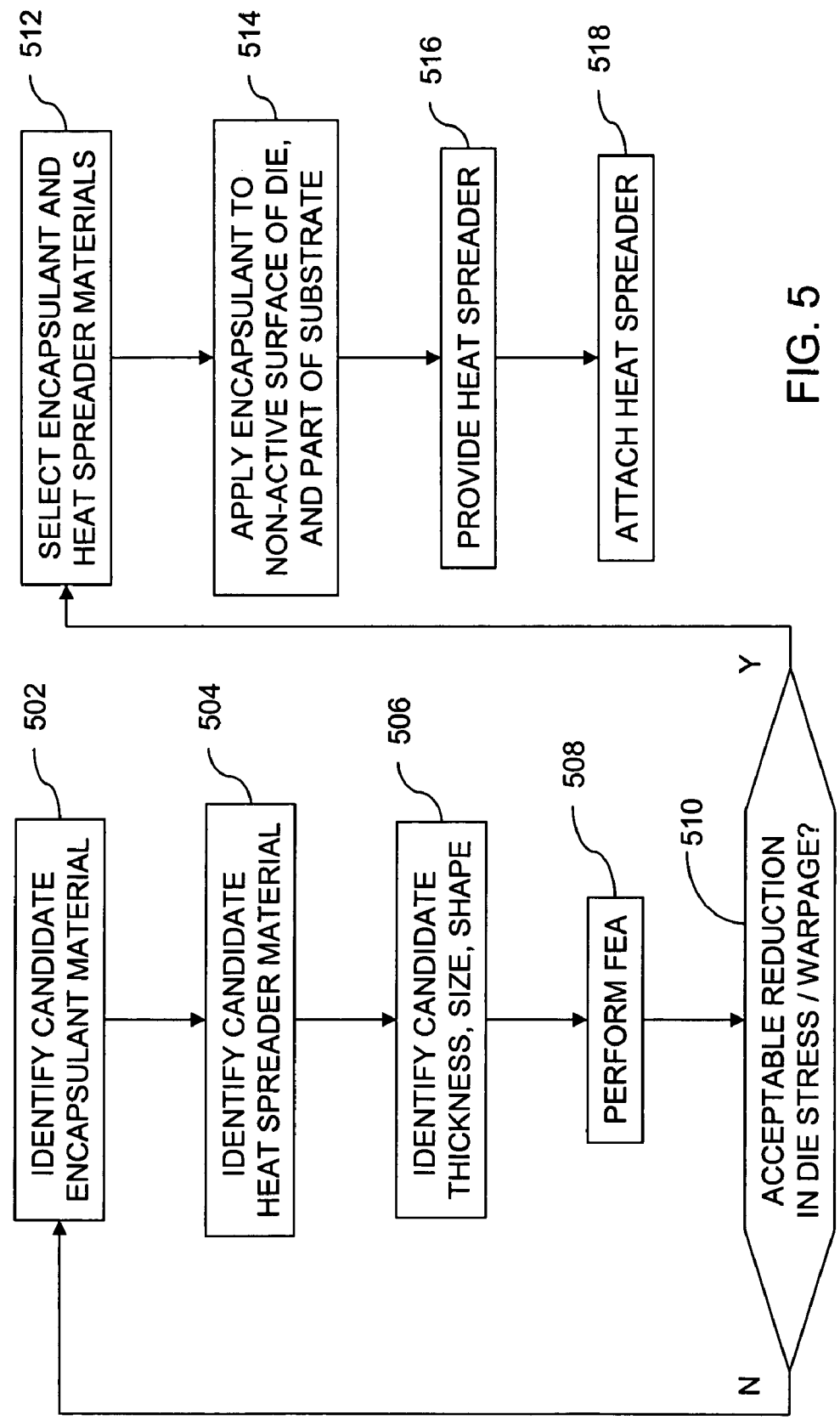
FIG. 5 is a flow chart diagram of a process for selecting and encapsulant and heat spreader materials and implementing the selected materials in a package.

Finite Element Analysis was used to compare die stress and warpage of an improved integrated circuit package to that of a corresponding prior art integrated circuit package. A structural simulation of the prior art integrated circuit package corresponding to FIG. 1 and case 3 of Table 1 was conducted using Finite Element Analysis to determine die stress and warpage in the structure. A structural simulation was also conducted on a corresponding integrated circuit package according to FIG. 3 using EME-770 (a thermal conductivity of 0,96 w/m*k) obtained from Sumitomo Chemical as the encapsulant. FIG. 5 shows an example of a Finite Element Analysis (FEA) mesh applied in these structural simulations. The results of the complete Finite Element Analysis are shown in Table 2 below.

TABLE 2

|  | Components | Prior Art | Encapsulant | Percentage Difference |
|---|---|---|---|---|
| Warpage (um) | Heat Spreader | 113 | 94 | −17% |
|  | Die | 107 | 55 | −49% |
|  | Substrate | 125 | 90 | −28% |
| Stress (MPa) | Die | 76 | 56 | −27% |

These results show significantly reduced die stress and warpage of the integrated circuit package.

FIG. 5 is a flow chart diagram of an exemplary process for selecting and implementing an optimized choice of encapsulant and heat spreader material.

At step 502, a candidate encapsulant material is identified. For example, any one of the encapsulant materials mentioned above may be used, as well as other encapsulants.

At step 504, a candidate heat spreader material is identified. For example, any one of the heat spreader materials mentioned above may be used, as well as others conductive materials.

At step 506, a candidate configuration of the heat spreader is identified. The identification may include thickness, shape and size of the heat spreader.

At step 508, a finite element analysis (FEA) is performed, using the parameters identified in steps 502, 504 and 506.

At step 510, the results of the FEA are evaluated, to determine whether the encapsulant material, heat spreader material, and heat spreader thickness, size, and shape provide an acceptable reduction in die stress and warpage. If the results are not acceptable, the loop of steps 502–510 is repeated. If the results are acceptable, then step 512 is performed.

At step 512, the candidate encapsulant, heat spreader material and configuration judged to provide acceptable results are selected.

At step 514, the selected encapsulant is applied (e.g., by molding) to the non-active surface of a die and a portion of the package substrate surrounding the die.

At step 516, a heat spreader made of the selected material is provided.

At step 518, the heat spreader is attached to the encapsulant.

Examples are disclosed above of an integrated circuit package having an attached heat spreader that provides not only physical protection during handling but also provides reduced die stress and warpage while maintaining or enhancing the operational life time of the package. Examples are disclosed above in which these features are provided even if the die is large relative to the size of the substrate.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method of providing an integrated circuit package having a die connected to a substrate in a flip-chip configuration, comprising the steps of:
    performing finite element analysis on said package using a plurality of sets of input parameters, each set of input parameters including a property of a respective encapsulant and a property of a corresponding heat spreader material;
    selecting one of the encapsulants corresponding to a selected one of the heat spreader materials based on results of the finite element analysis;
    applying the selected encapsulant to a non-active surface of said die and at least a portion of an exposed surface of said substrate adjacent said die;
    providing a heat spreader made from the selected heat spreader material; and
    attaching said heat spreader to the surface of said encapsulant.

2. The method of claim 1 further comprising the step of attaching said heat spreader to the surface of said substrate.

3. The method of claim 1, wherein said heat spreader comprises corner posts attached to the substrate.

4. The method of claim 1, wherein the encapsulant is selected so that warpage and die stress are not greater than a predetermined level for a given selected heat spreader material.

5. The method of claim 1, wherein the heat spreader material is selected so that warpage and die stress are not greater than a predetermined level.

6. The method of claim 1, wherein a thickness, size and shape of said package are selected so that warpage and die stress are not greater than a predetermined level.

7. The method of claim 1, wherein said package is a chip scale package.

8. The method of claim 1, wherein said encapsulant is shaped by a molding process.

9. The method of claim 1, wherein said heat spreader has an open configuration.

10. The method of claim 9, wherein said heat spreader having the open configuration does not directly contact the substrate.

11. The method of claim 9, wherein said open configuration comprises corner posts attached to the substrate.

12. The method of claim 1, further comprising performing a design of experiment for the input parameters to evaluate combinations of the encapsulant, the heat spreader material and physical dimensions of the heat spreader with respect to warpage and die stress.

* * * * *